United States Patent [19]
Fry et al.

[11] Patent Number: 4,901,820
[45] Date of Patent: Feb. 20, 1990

[54] GOLD TAB LUBRICATION

[75] Inventors: Boyd M. Fry, Georgetown; Pratap Singh, Round Rock; Joseph T. Spalik, Gerogetown; Kerry D. Sweazea, Leander, all of Tex.

[73] Assignee: International Business Machines Corporation, Armonk, N.Y.

[21] Appl. No.: 250,463

[22] Filed: Sep. 28, 1988

[51] Int. Cl.⁴ .......................... F16N 7/12; F16N 7/16; F16N 7/24; F16N 25/04
[52] U.S. Cl. ..................................... 184/64; 184/15.1; 184/17; 184/101
[58] Field of Search ...................... 184/64, 17, 16, 101, 184/15.1, 102; 198/624, 500

[56] References Cited

U.S. PATENT DOCUMENTS

| | | | |
|---|---|---|---|
| 431,779 | 7/1890 | McDowell-Guajardo | 184/64 |
| 1,093,609 | 4/1914 | Doeg | 184/64 |
| 1,416,313 | 5/1922 | Astbury | 184/102 |
| 1,499,142 | 6/1924 | Baker et al. | 184/16 |
| 4,159,222 | 6/1979 | Lebow et al. | 156/632 |
| 4,529,531 | 7/1985 | Padovani | 252/56 S |
| 4,638,761 | 1/1987 | Carrick | 184/17 |
| 4,678,178 | 7/1987 | Akiyama et al. | 198/624 |

FOREIGN PATENT DOCUMENTS 206928 6/1959 Austria ............................. 184/16

Primary Examiner—Henry A. Bennet
Assistant Examiner—Denise L. Ferensic
Attorney, Agent, or Firm—Andrea P. Bryant

[57] ABSTRACT

Apparatus and a method are disclosed for automatically applying uniform amounts of oily lubricant to electrical contact tabs on one or more edges on one or both sides of a printed circuit card, simultaneously, by conveying the card past one or more lubrication stations in wiping contact with free rolling rollers adapted for contacting a wick continuously supplied with lubricant.

11 Claims, 5 Drawing Sheets

GOLD TAB LUBRICATION

BACKGROUND OF THE INVENTION

1. Field of the Invention

The present invention relates to lubricating electrical contact pads located along the edges of printed circuit cards. More specifically it relates to automatically and reliably applying uniform amounts of liquid lubricant to gold electrical contact tabs.

2. Description of the Prior Art

In the computer industry, there is frequently a need to replace printed circuit cards during the life of a machine. Galling and brittle fracture of noble plating material occurs when contact force per unit area exceeds the strength of the substrate metal. Failure of a connector through increased resistance can be caused by excessive wear resulting from friction of mating parts and may also cause interference with operation of the connector. Excessive wear is detrimental from an electrical as well as mechanical view point.

It is known that a lubricant can have beneficial electrical as well as mechanical effects. A lubricant when applied to separable contacts as a thin film reduces friction and wear during sliding action of contacting surfaces. Wear reduction is particularly important where thin precious metal plating is used over base metal.

A method for use in a manufacturing process for applying a thin, uniform layer of lubricant on gold contact tabs is desirable. Conventional methods include felt tips with lubricant, cotton swabs with lubricant, and wiping on lubricant with a lint free cloth. The main drawback of these methods is that the amount of lubricant on contact tabs is not consistent due to the manual nature of the methods.

Therefore, it is desirable to assure that card contact edges are lubricated at the time of manufacture with a sufficient amount of lubricant to enable specified insertions and retractions of such cards during their useful life. In some instances this lifetime may be expected to last for up to five years and include as many as 25 insertions/retractions. It has been found that liquid lubricants are most effective for providing lifetime lubrication at the time the cards are manufactured. However, the problem of assuring uniform application of lubricant has not been solved with total success; and in fact is often a manual step — with its inherent deficiencies in repeatability and reliability.

Other methods of lubricating printed circuitry have included applying a layer of spray wax and using rollers such as taught in U.S. Pat. No. 4,159,222 to Lebow et al. U.S. Pat. No. 4,268,568 to Sard et al describes electrical contacts on printed circuit boards, which contacts incorporates a fluorocarbon polymer film as a lubricant. U.S. Pat. Nos. 4,529,531 and 4,530,772 to Padovani and Timony, respectively, disclose electric contact lubricants and methods of using them. In each case the method comprises adding the disclosed lubricant to the contacts.

In an automated production environment, it is desirable for the lubrication process to perform several functions including supplying a continuous lubricant film in controlled amounts while moving a card past the supply point at a controllable speed, while accommodating card thickness variations.

SUMMARY OF THE INVENTION

The present invention provides apparatus and a inherent method for applying uniform amounts of liquid lubricant in a reliable, consistently repeatable manner to electrical contacts located along an edge of printed circuit cards conveyed at a uniform rate of speed past a lubricant applying station. Lubricant is applied from a free rolling roller which in one embodiment of the present invention is a roughened rubber roller having helical grooves formed therein in contact with a lintless fibrous wick connected to supply of the lubricant. In another embodiment, the free rolling roller has a lintless, fibrous surface material attached to its surface to which the lubricant is directly supplied.

Drive rollers are provided for conveying the cards. Rollers may be mounted on an adjustable block so that spacing between rollers can be varied to accommodate different card thicknesses. A rail may be used to guide a card through rollers and provide a reference for control of oil film thickness with respect to tab edge.

Lubricant flow adjustment may be made at the lubricant reservoir and is affected by factors such as card speed and geometrical attributes of gold tabs. Desired flow rate may be determined by lubing a run ahead sample so as to obtain a uniform oil film on tabs without oil globs or oil starvation. Card speed may be adjusted.

Lubricant applicator drive rollers should be cleaned periodically with a lint free cloth. When not in use, precautions should be taken to avoid dust accumulations on the lubricant application rollers.

BRIEF DESCRIPTION OF THE DRAWING

These and other aspects of the present invention will be readily apparent to those skilled in the art by reading of the detailed description which follows, taken in connection with the accompanying drawing wherein.

DESCRIPTION OF THE PREFERRED EMBODIMENT

Figure 1:
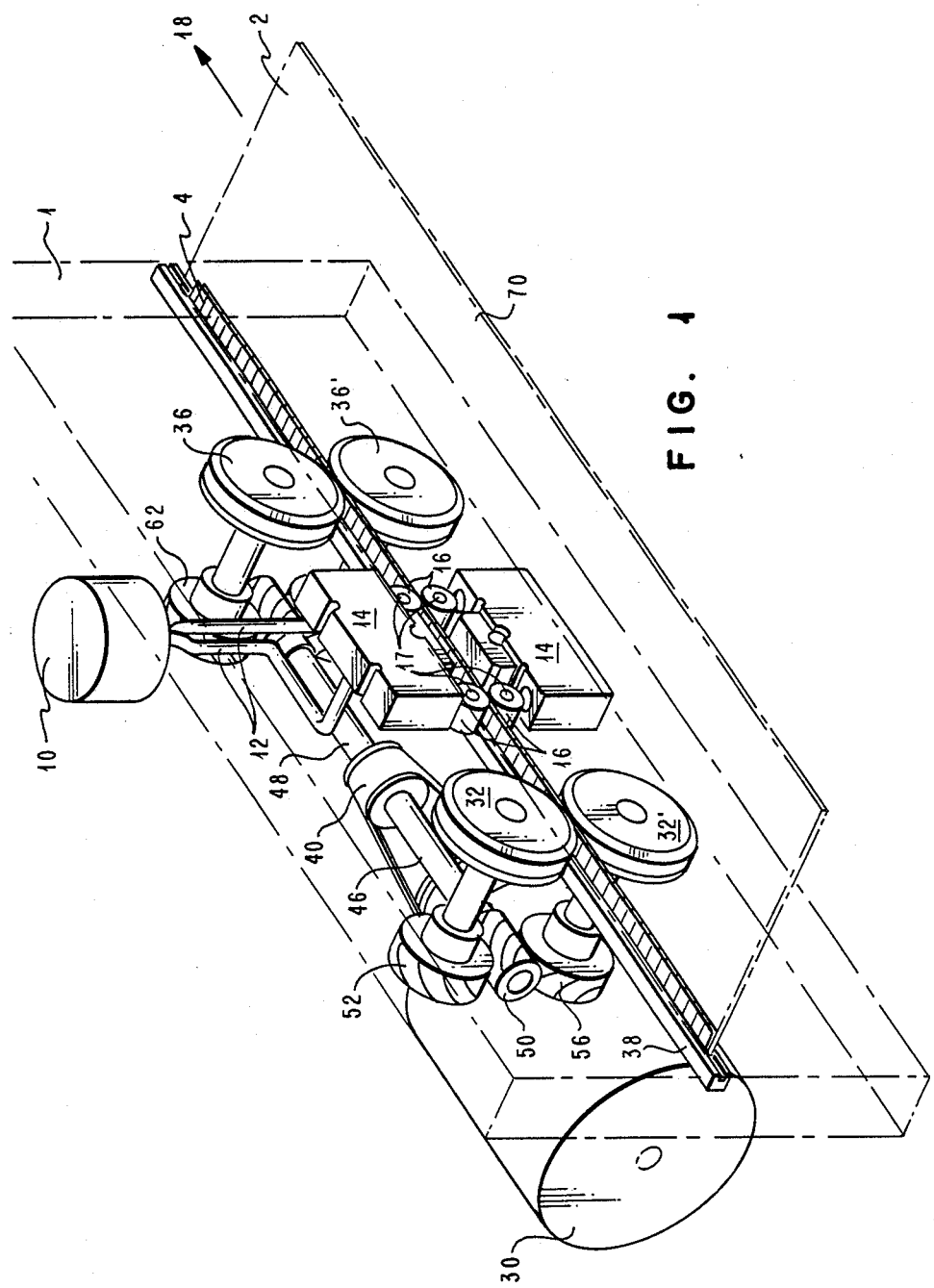
FIG. 1 is a front perspective view of apparatus embodying the present invention.

FIG. 1 is a schematic illustration of apparatus embodying the present invention. The lubricating apparatus is attached to mounting plate 1. Printed circuit card 2 has a variety of components inserted or mounted thereon. These components are not shown as they are not part of the present invention. Circuitry not shown on cards terminates in any of a plurality of edge tabs 4, which are typically plated with gold. It is these electrical contact tabs 4 which are shown along one side of card 2; but as is well understood by those having skill in the art, may be provided along the other linear edge on one or both linear edges on the opposite planar side as well.

These tabs during the useful life of the card will be inserted and retracted many times from the mating connector. Lubricant is desirably provided on edge tabs 4 as one of the final steps after the component assembly in the manufacture of the printed circuit card. A lubricant is preferably chosen to have characteristics which will enable it to last the useful life of the card.

In the present invention, lubricant from source 10 is provided through appropriate piping 12 to a lubrication station indicated generally at 14. Lubricant is applied to edge contact tabs 4 as they pass in wiping contact with lubricant applicator rollers 16. Rollers 16 are free rolling and mounted on studs 17 in plate 1. It has been found that two rollers 16 usually provide better coverage than a single roller.

The structure of applicator station 14 will be discussed in greater detail in connection with FIG. 4.

Means are provided for conveying card 2 at a uniform rate of speed past lubrication station 14 in the direction of arrow 18. Motor 30 is provided for driving entry roller pair 32, 32' and exit roller pair 36, 36'. Rollers 32, 32', 36 and 36' convey card 2, the edge of which is to be lubricated is aligned by means of guide rail 38.

Figure 2:
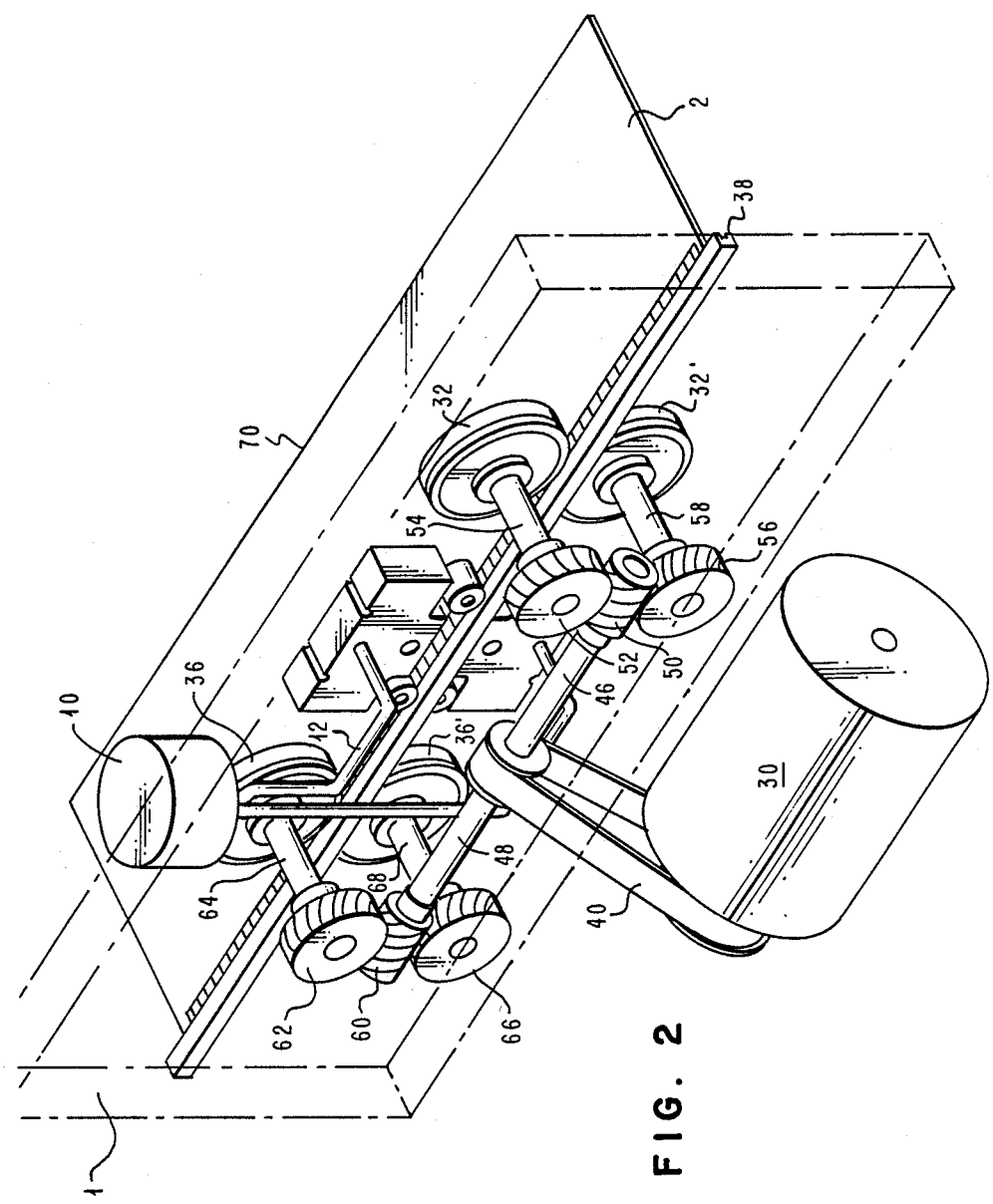
FIG. 2 is a rear perspective view of the apparatus of FIG. 1.

Refer now to both FIG. 1 and FIG. 2, a rear view of the apparatus of FIG. 1 with mounting plate 1 removed for clarity. Motor 30 drives shafts 46 and 48 via belt 40. Shaft 46 drives rollers 32 and 32'. Shaft 48 drives rollers 36 and 36' in the direction as shown in FIG. 1. It is extremely important that rollers 32, 32', 36 and 36' be driven in synchronism so that they rotate at the same constant rate. One motor with appropriate motion transmission mechanism may be used. Those having skill in the art will understand this is not a necessary limitation and that other motive means may be used.

Shaft 46 terminates in worm screw 50 adjacent worm wheel 52 which is drivingly attached to feed roller 32 via shaft 54. Similarly, worm wheel 56, driven by worm screw 50, drives shaft 58 fixedly attached to feed roller 32'.

Shaft 48 terminates in worm screw 60 which drives worm wheels 62 and 66. Worm wheel 62 drives exit roller 36 via shaft 64. In like manner, exit roller 36' is driven by worm wheel 66 via shaft 68.

It has been found that a rate of speed in the range of about 16 to 50 inches per minute is most appropriate for practicing the instant invention. With that rate of speed, an appropriate amount of lubricant is applied to edge contact tabs 4 as they pass beneath applicator rollers 16.

The position of rollers 32 and 32', 36 and 36' may be adjustable along their respective shafts 54, 58, 64 and 68, so that depending on the layout of components on a given card, a linear path parallel to the contact edge of a card 2 is described. In any case, rollers 32 and 36 should contact the surface of card 2 and define a linear path so as not to interfere with or damage components on card 2.

It should be noted a mirror image of the device of FIGS. 1 & 2 may be provided along the opposite edge 70 of card 2 for lubricating contact tabs on that side. Again, those having skill in the art will understand the critical nature of the requirement of driving all drive rollers at the same constant rate of speed.

Figure 3B:
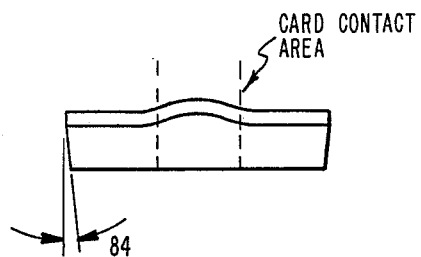
FIG. 3 shows in more detail the structure of the drive and exit rollers of FIGS. 1 & 2.
Figure 3A:
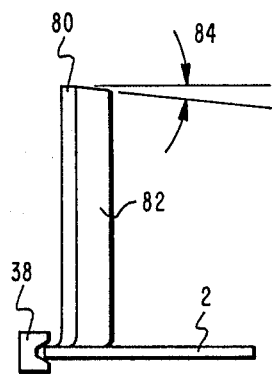
Figure 3C:
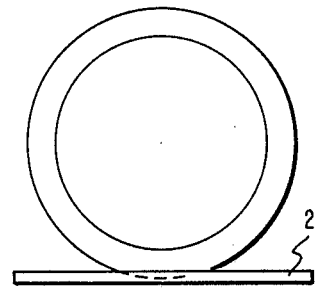

The structure of rollers 32, 32', 36 and 36' is of particular importance in the operation of the present invention. FIG. 3A is a schematic cross-section of any of the drive or exit rollers 32, 32', 36, 36'. Each roller has a cylindrical portion 80 and a frusto conical portion 82 such that the roller taken as a whole is frusto conical in shape. The angle 84 of the cone is preferably in the range from 5–10 degrees. FIG. 3B shows the deformation of roller portions 80 and 82 as the roller rotates. Thus, the deformation of the portion 82 is toward rail 38 of FIG. 1. The phenomenon of conical rollers having both an edge aligning and forward driving face components is will known. However, additional advantages proceed in the instant invention from the structure of the rollers in that in addition to keeping card 2 aligned against rail 38, exit rollers 36 and 36' provide the advantage of smearing oil applied at lubricating station 14. The combined results of the free rotation of lubrication applicator rollers 16 and exit rollers 36 and 36' is to assure the smooth distribution of the lubricant and eliminate any spotty oil deposits.

Rollers 32, 32', 36 and 36' which comprise the entry and exit roller pairs are spaced apart from each other a distance somewhat less than the thickness of the card edge to be lubricated. It has been found that the distance between upper rollers, 32 and 35, and their lower cooperating rollers, 32' and 36', should be 0.010" to 0.020" less than the thickness t of the card 2 having its edge tabs 4 lubricated (FIG. 1).

Figure 4:
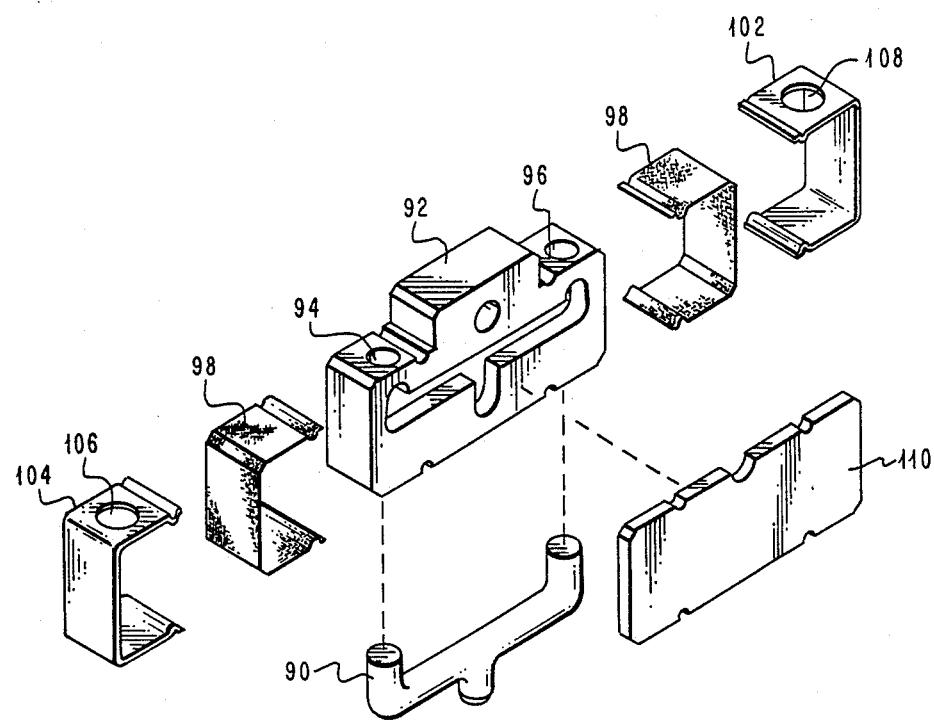
FIG. 4 is an expanded view of lubrication station 14.
Figure 5:
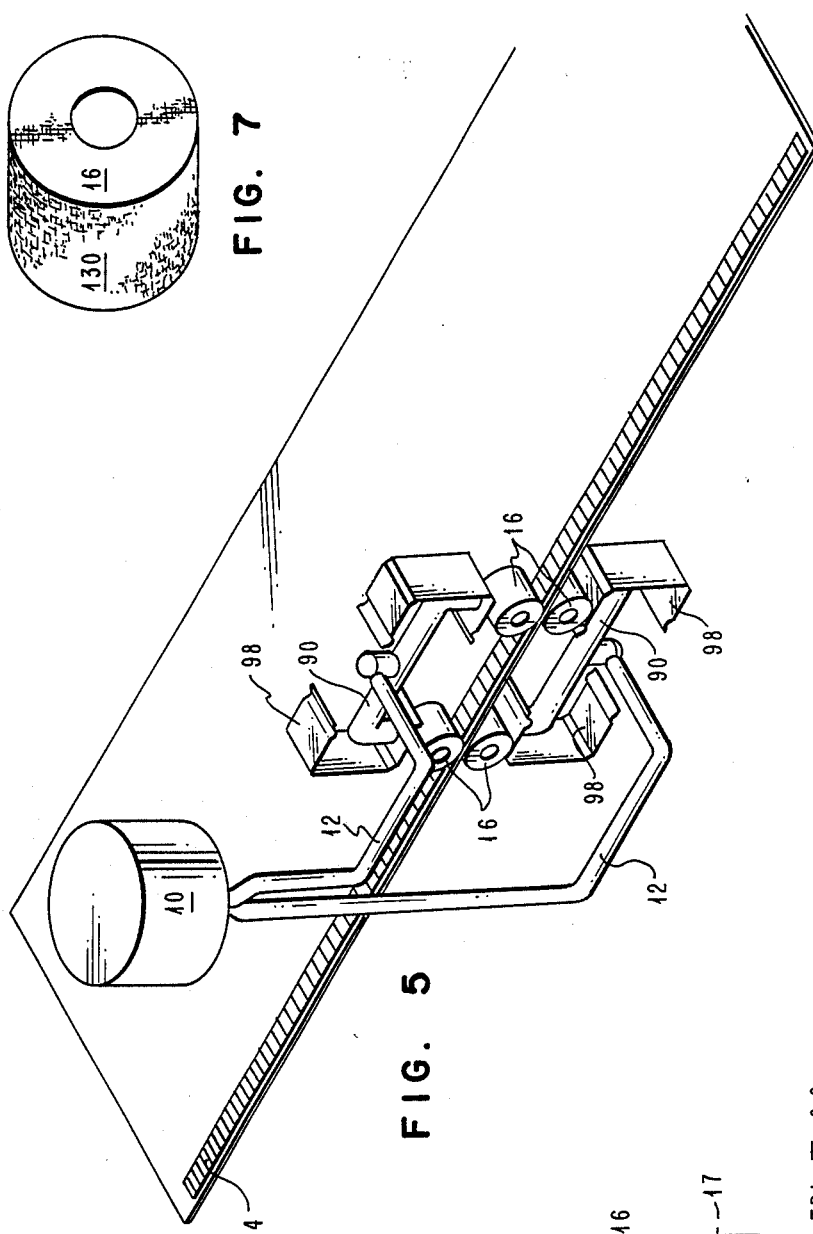
FIG. 5 shows details of oil supply to lubricating station 14.

Refer now to FIG. 4 which is an exploded view of a lubricating station 14. A generally Y shaped felt wick 90 is inserted into block 92 so that the upright ends of felt wick 90 protrude somewhat through holes 94 and 96 in block 92. Two lintless fiber pads 98 are provided and held in place with clips 102 and 104. Holes 106 and 108 in clips 102 and 104 allow oil filtered through pads 98 to be presented to rollers 16 (FIG. 1). Cover plate 110 completes the subassembly. Not shown in FIG. 4 but shown in FIG. 5 is the place at which piping 12 enters lubricating station 14 (FIG. 1) for continuously supplying oil from source 10 to wick 90. When lubricating station 14 is assembled, the ends of wick 90 protrude somewhat through the holes 106 and 108 provided in metal spring clips 102 and 104 respectively. Pads 98 prevent transfer of fibers from wick 90 to rollers 16.

FIG. 5 is a schematic diagram showing only those parts of the apparatus relating to oil supply. Thus it can be seen that lubricant from source 10, which may be any suitable commercially available regulated gravity feed device, is provided to applicator rollers 16 from wicking member 90 to which lubricant is directly supplied. In abutting relationship to both wicking member 90 and applicator roller 16, are lintless, fibrous pads 98 (FIG. 4). With each rotation of rollers 16, their surface contacts pads 98.

The two lubricating stations 14 shown in FIGS. 1, 2, 4, and 5 are constructed exactly alike. If, in the modification to the present invention, wherein edge connector tabs on parallel sides on the same planar surface of a circuit board 2 are to be lubricated, a mirror image of the apparatus shown and described in connection with FIGS. 1, 2 and 5 is provided.

Advantageously, wick 90 is quarter inch diameter felt. Felt wicking of this type is commercially available and manufactured for oil lubricating systems that deliver lubricants from a reservoir to a bearing surface. Gravity feed oil reservoirs are also commercially available and therefore not shown in detail in the present invention.

While rail 38 has been illustrated for guiding card 2 through the apparatus of the invention, other guide means are possible. For example, rollers may be provided in mounting plate 1 at spaced intervals with the surface of the plate 1 adjacent card 2 having an indentation against which the card edge may be aligned, in the same manner as rail 38.

Figure 6:
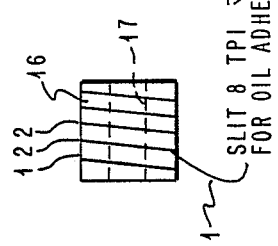
FIG. 6 shows a helically grooved lubricant roller.

FIG. 6 is illustrative of one embodiment of the present invention in which rollers 16 are formed preferably of treated rubber having a roughened surface. Helical grooves 122, generally perpendicular to stud 17 (FIG. 1) are provided to improve retention of lubricant oil on the roller surface. It has been found that grooves having a depth of about 0.030 inch at 8 threads per inch (TPI) provide good results. Those skilled in the art will understand that these dimensions may differ, primarily as a function of the characteristics of lubricant 10 to be applied to edge connector tabs 4 (FIG. 1)

Figure 7:
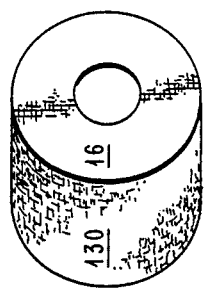
FIG. 7 shows an alternative lubricant application roller.

Refer now to FIG. 7 which shows another suitable lubricating roller 16 with a lintless material 130 on its surface. Preferably lintless material 130 is cotton and has a thickness of 0.010–0.030 inch. A suitable lubricant for use with this material is Stauffer Electronic Lubricant CL-920. Other materials may be used as appropriate to the characteristics of the lubricant to be applied.

While the invention has been illustrated where the lubricant supply is gravity fed, those having skill in the art will understand that other mechanisms may be employed for supplying a constant amount of oil or other lubricant continuously to wick 90.

In operation, the apparatus shown in FIG. 1 may be embodied as a last step in a single side printed circuit manufacture facility or as a separate process at another site. In either case, cards requiring edge connector lubication are conveyed under the influence of drive rollers 32 and 32' and exit rollers 36 and 36', so as to lubricate edge connector tabs 4 through wiping contact with applicator rollers 16. Roller pairs 32-32', 36-36' are positioned such that the distance between them is somewhat less in thickness than that of a printed circuit card 2 to be driven by the roller pairs. A difference of about 0.010–0.020 in. is preferred.

While the invention has been shown and described having reference to a preferred embodiment and modifications thereto, those having skill in the art will understand that various other changes in form and detail may be made without departing from the spirit and scope of the invention as claimed.

We claim:

1. Apparatus for applying uniform amounts of liquid lubricant to electrical contact tabs located along at least an edge of a printed circuit card comprising:
    first free rolling lubricant applicator means;
    means for conveying said printed circuit card along a linear path at a predetermined, constant rate of speed in wiping contact past said lubricant applicator means;
    a supply of lubricant; and
    means, including at least one wicking member, connecting said lubricant supply to said applicator means.

2. The apparatus of claim 1 wherein said means for conveying includes:
    at least a pair of opposed drive rollers, adjustably positionable along drive shafts associated therewith for rotation about an axis parallel to a planar surface of the card, so as to engage a first and second side of the card along a linear path coincident with said electrical contact tabs; and
    motor means drivingly connected to said associated shafts,
    said means for conveying comprising a pair of opposed rollers, each of said rollers having a substantially frusto conical shape.

3. The apparatus of claims 1 or 2 wherein said applicator means comprises:
    at least a resilient roller, having a roughened surface in which helical grooves are formed ; and
    means for causing said at least one roller to engage said wicking member on each roller rotation for obtaining lubricant from said supply of lubricant.

4. The apparatus of claims 1 or 2 wherein said applicator means comprises:
    at least a roller having its outer surface covered with lintless material, and located in abutting relation to said means for connecting.

5. The apparatus of claim 1 wherein said means for conveying includes:
    a plurality of pairs of opposed rollers, disposed in parallel with said applicator means, and located at points along said linear path before and after said applicator means.

6. The apparatus of claim 5, additionally including:
    second lubricant applicator means positioned in opposed relation to said first lubricant applicator means for simultaneously applying lubricant to electrical contacts located along another edge, opposed to said first edge, of said printed circuit card.

7. The apparatus of claim 6 wherein said first lubricant applicator means comprises:
    at least a roller, having a roughened surface in which helical grooves are formed; and
    means for causing said at least one roller to engage said fibrous wicking member on each roller rotation for obtaining lubricant from said supply of lubricant.

8. A method of applying uniform amounts of liquid lubricant to planar electrical contacts located along a first edge of a printed circuit board comprising:
    providing a first station having a lintless applicator with a continuous supply of lubricant; and
    conveying said circuit board at a predetermined constant rate in a linear path past said applicator in wiping contact therewith.

9. The method of claim 8 additionally including:
    providing a second station opposed from said first station, having a fibrous, lintless applicator with a continuous supply of lubricant; and
    said conveying step includes simultaneously conveying said circuit board past said second station for applying uniform amounts of liquid lubricant to planar electrical contact tabs located along a second edge of said printed circuit board, opposed to said first edge.

10. The apparatus of claim 6 wherein said means for conveying includes means for maintaining said constant rate to be in the range of 16 in/min to 50 in/min.

11. The apparatus of claim 3 wherein the roughened surface of said at least one resilient roller includes helical grooves having a depth of 0.030 inch and spaced at intervals of 8 TPI.

* * * * *